(12) United States Patent
Chang et al.

(10) Patent No.: US 12,255,166 B2
(45) Date of Patent: Mar. 18, 2025

(54) SEMICONDUCTOR PACKAGE STRUCTURE COMPRISING VIA STRUCTURE AND REDISTRIBUTION LAYER STRUCTURE

(71) Applicant: TAIWAN SEMICONDUCTOR MANUFACTURING COMPANY, LTD., Hsinchu (TW)

(72) Inventors: Neng-Chieh Chang, Tainan (TW); Po-Hao Tsai, Taoyuan (TW); Ming-Da Cheng, Taoyuan (TW); Wen-Hsiung Lu, Tainan (TW); Hsu-Lun Liu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/484,609

(22) Filed: Oct. 11, 2023

(65) Prior Publication Data

US 2024/0047403 A1    Feb. 8, 2024

Related U.S. Application Data

(62) Division of application No. 17/460,647, filed on Aug. 30, 2021, now Pat. No. 11,817,413.

(51) Int. Cl.
*H01L 21/56* (2006.01)
*H01L 23/00* (2006.01)
*H01L 25/10* (2006.01)

(52) U.S. Cl.
CPC ............ *H01L 24/20* (2013.01); *H01L 21/561* (2013.01); *H01L 24/19* (2013.01); *H01L 24/24* (2013.01); *H01L 24/82* (2013.01); *H01L 24/96* (2013.01); *H01L 25/105* (2013.01); *H01L 24/04* (2013.01); *H01L 24/05* (2013.01); *H01L 24/13* (2013.01); *H01L 2224/0401* (2013.01); *H01L 2224/05569* (2013.01); *H01L 2224/13024* (2013.01);
(Continued)

(58) Field of Classification Search
CPC ............. H01L 24/04–25; H01L 21/561; H01L 21/565; H01L 24/82; H01L 2224/821; H01L 2225/1058
USPC ........ 257/774; 438/629, 637, 639, 640, 667, 438/668, 672, 675, 700, 701, 713, 978
See application file for complete search history.

(56) References Cited

U.S. PATENT DOCUMENTS 9,000,584 B2    4/2015 Lin et al.
9,048,222 B2    6/2015 Hung et al.
(Continued)

*Primary Examiner* — Didarul A Mazumder
(74) *Attorney, Agent, or Firm* — Birch, Stewart, Kolasch & Birch, LLP

(57) ABSTRACT

A semiconductor package structure includes a conductive pad formed over a substrate. The semiconductor package structure also includes a passivation layer formed over the conductive pad. The semiconductor package structure further includes a first via structure formed through the passivation layer and in contact with the conductive pad. The semiconductor package structure also includes a first encapsulating material surrounding the first via structure. The semiconductor package structure further includes a redistribution layer structure formed over the first via structure. The first via structure has a lateral extending portion embedded in the first encapsulating material near a top surface of the first via structure, and the lateral extending portion has a width increasing in a direction toward the redistribution layer structure.

20 Claims, 13 Drawing Sheets

(52) U.S. Cl.
    CPC .... *H01L 2224/19* (2013.01); *H01L 2224/214* (2013.01); *H01L 2224/215* (2013.01); *H01L 2224/24175* (2013.01); *H01L 2224/821* (2013.01); *H01L 2225/1035* (2013.01); *H01L 2225/1058* (2013.01); *H01L 2924/01013* (2013.01); *H01L 2924/01029* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0264930 A1* | 9/2014 | Yu ............... H01L 23/3185 257/774 |
| 2016/0049330 A1* | 2/2016 | Peng ............. H01L 23/5226 257/774 |
| 2016/0141213 A1* | 5/2016 | Bishop ........... H01L 24/20 438/16 |
| 2017/0338196 A1* | 11/2017 | Chiu ............. H01L 24/06 |
| 2018/0151478 A1* | 5/2018 | Chen ............. H01L 24/73 |
| 2019/0157121 A1* | 5/2019 | Liao ............. C08G 73/105 |
| 2020/0006141 A1* | 1/2020 | Wang ............. H01L 23/3171 |
| 2020/0020628 A1 | 1/2020 | Huang et al. |
| 2021/0020584 A1* | 1/2021 | Yu ............... H01L 21/568 |
| 2021/0020594 A1* | 1/2021 | Chiu ............. H01L 24/19 |
| 2021/0125961 A1 | 4/2021 | Tsai et al. |
| 2021/0210423 A1* | 7/2021 | Chang ........... H01L 21/76871 |

\* cited by examiner

SEMICONDUCTOR PACKAGE STRUCTURE COMPRISING VIA STRUCTURE AND REDISTRIBUTION LAYER STRUCTURE

PRIORITY CLAIM AND CROSS-REFERENCE

This application is a Divisional application of U.S. patent application Ser. No. 17/460,647, filed on Aug. 30, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
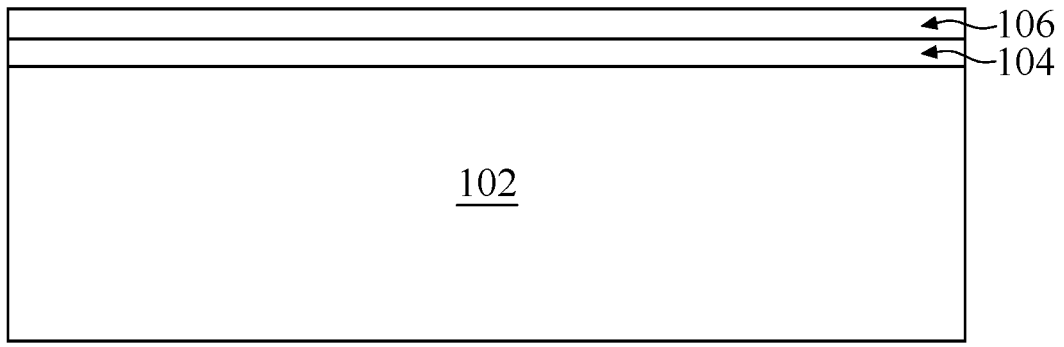
FIGS. 1A-1O are cross-sectional representations of various stages of forming a semiconductor package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor package structure are provided. The method for forming the semiconductor package structure may include forming a ductile via structure with lower hardness in an encapsulating material. During subsequent planarization process, a lateral extending portion of the ductile via structure is formed near the top surface of the via structure. Since the top surface of the via structure is enlarged, the landing area of redistribution layer structure may be increased. With ductile via structure, the via structure profile may be well controlled and electrical bridge defect and fail issue may be avoided.

Figure 1B:
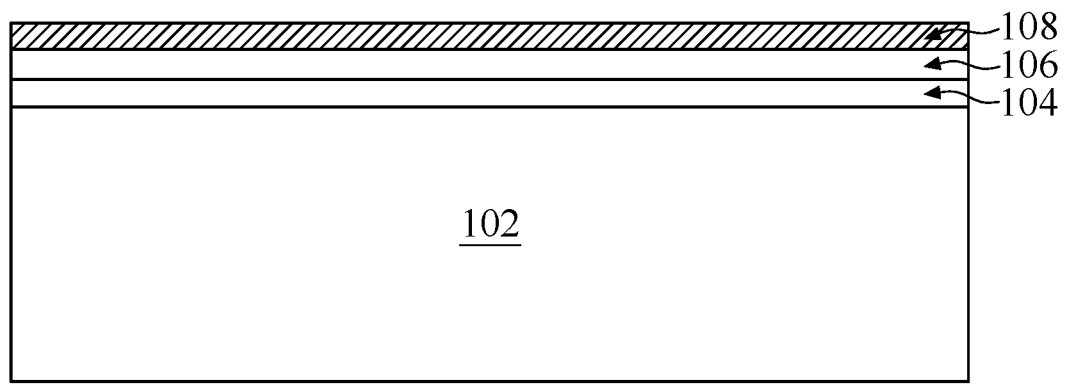
FIGS. 2-1 and 2-2 are enlarged cross-sectional views of a semiconductor package structure, in accordance with some embodiments of the disclosure.
Figure 1C:
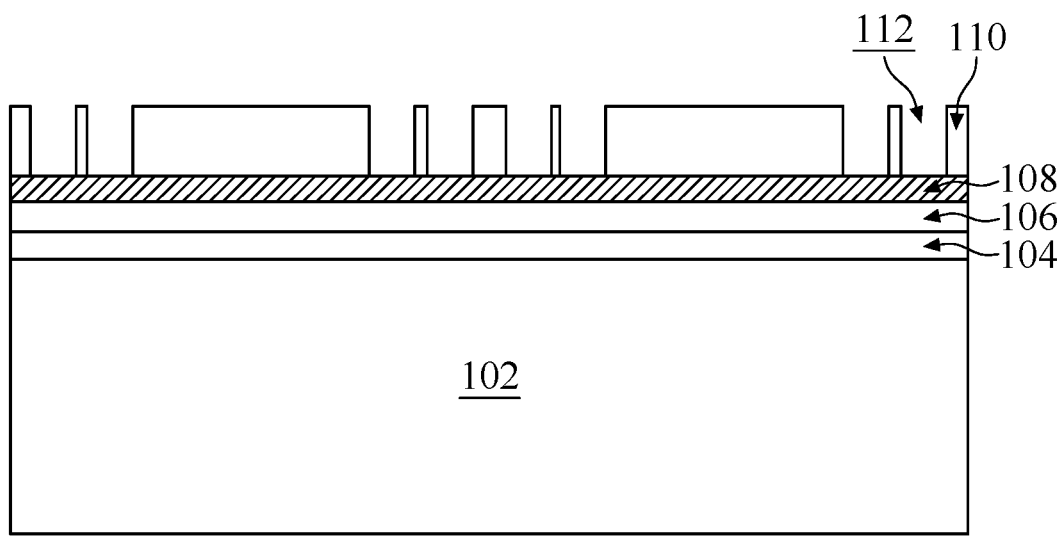
Figure 1D:
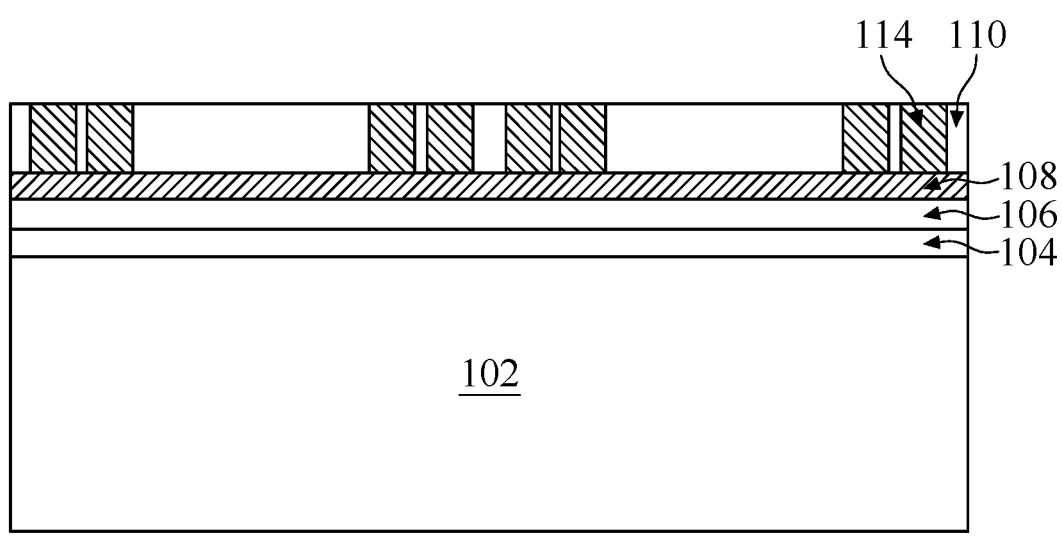
Figure 1E:
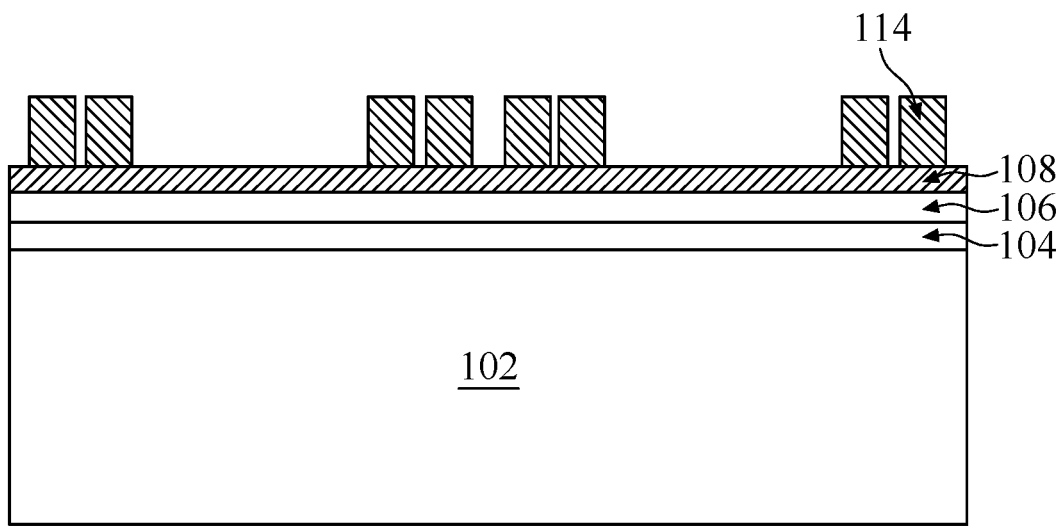
Figure 1F:
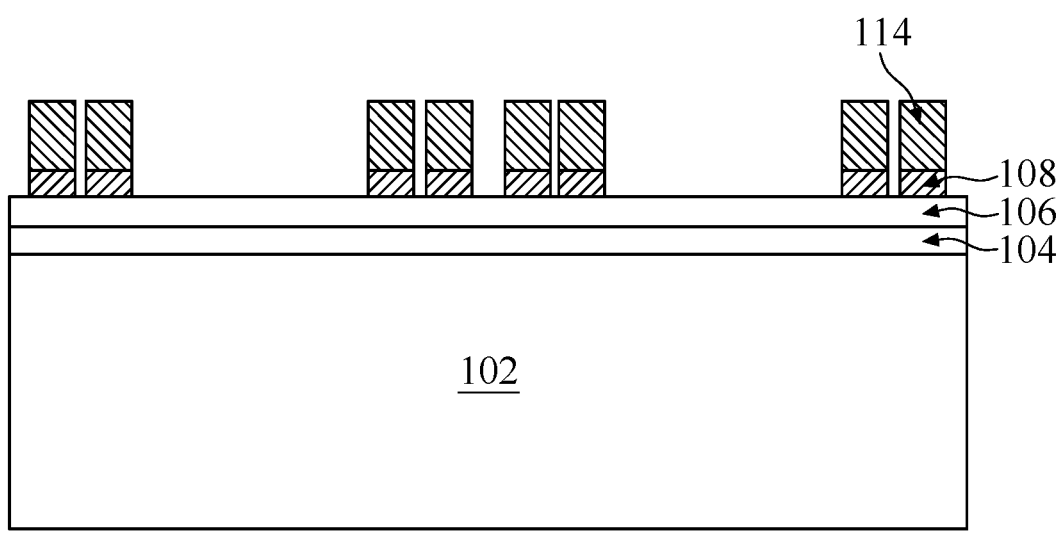
Figure 1G:
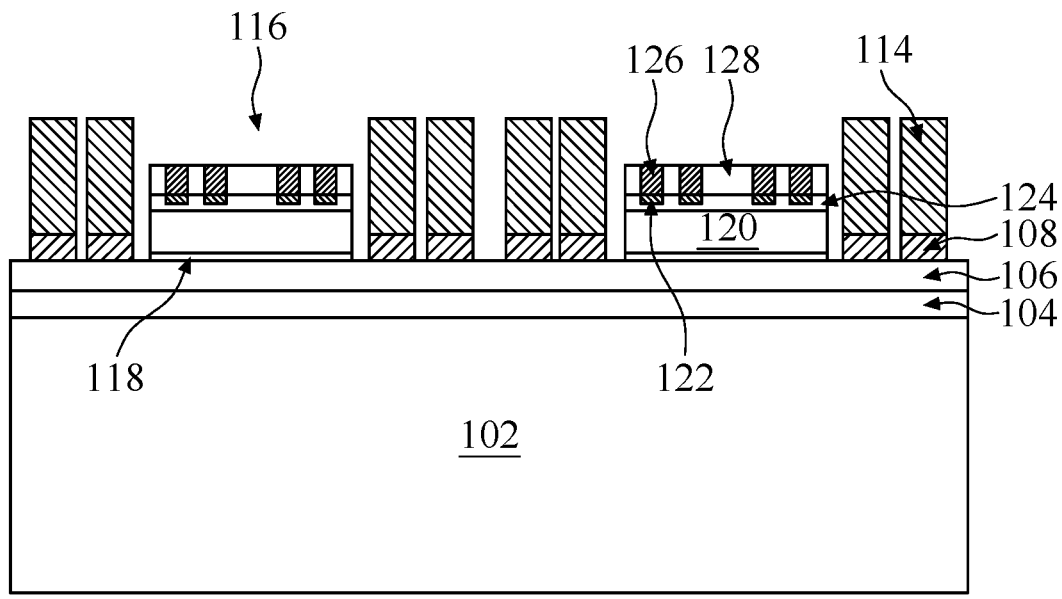
Figure 1H:
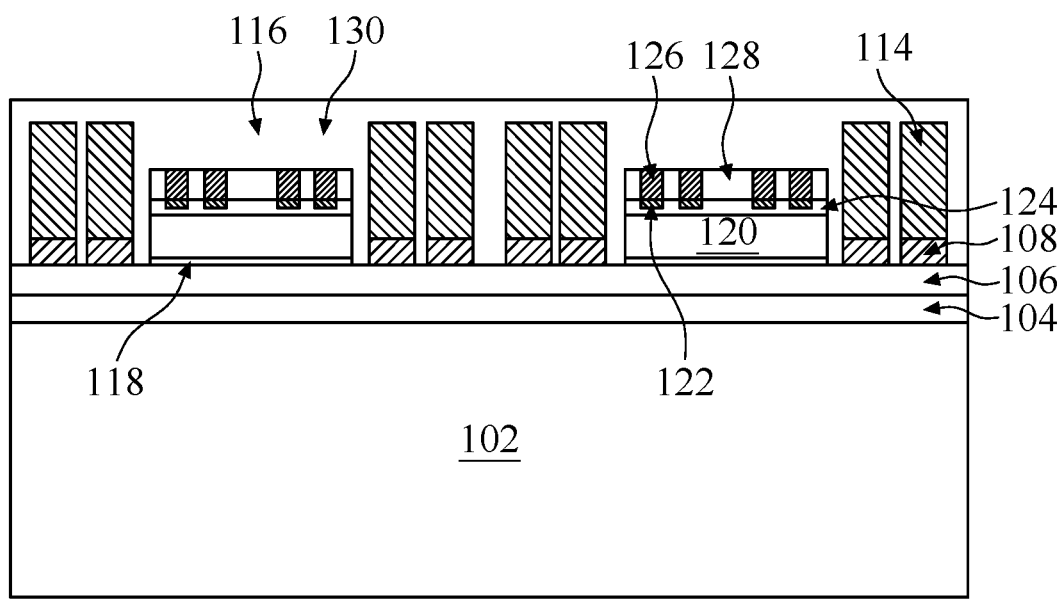
Figure 1I:
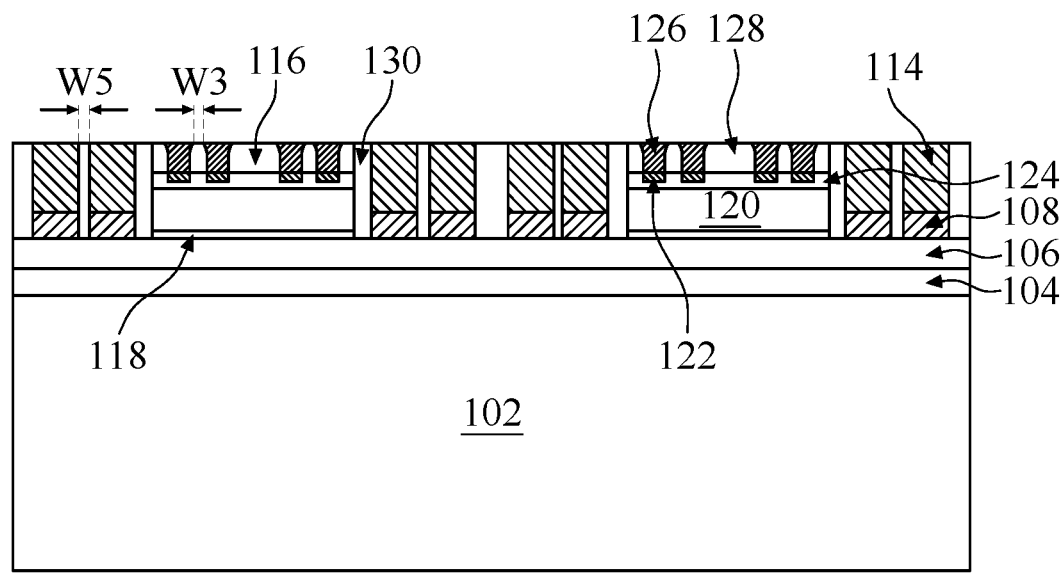
Figure 1J:
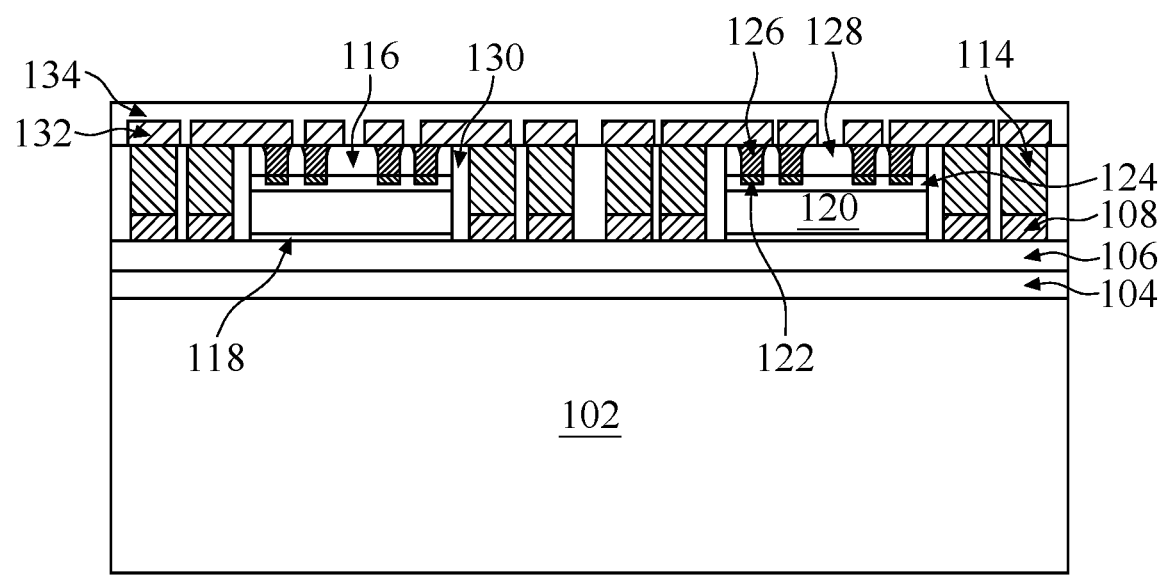
Figure 1K:
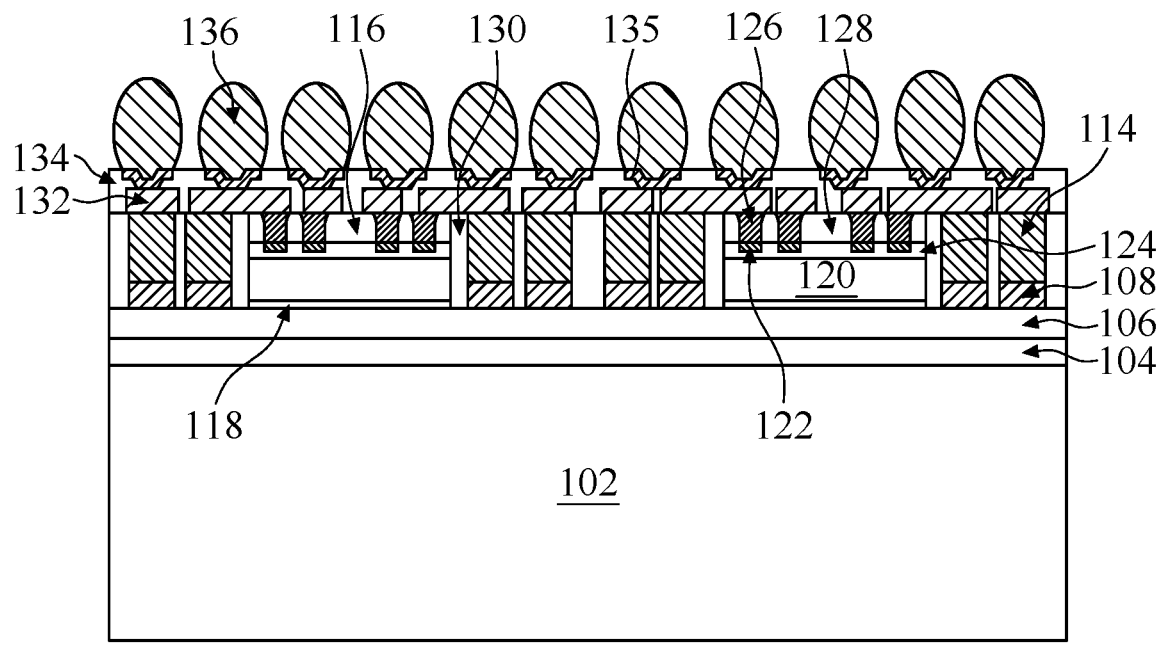
Figure 1L:
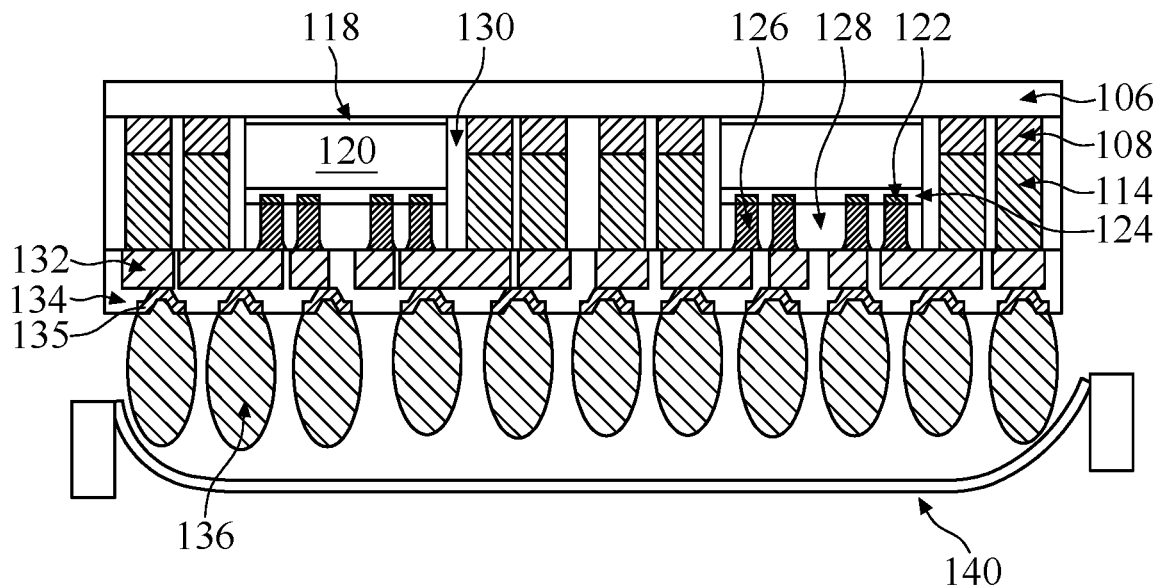
Figure 1M:
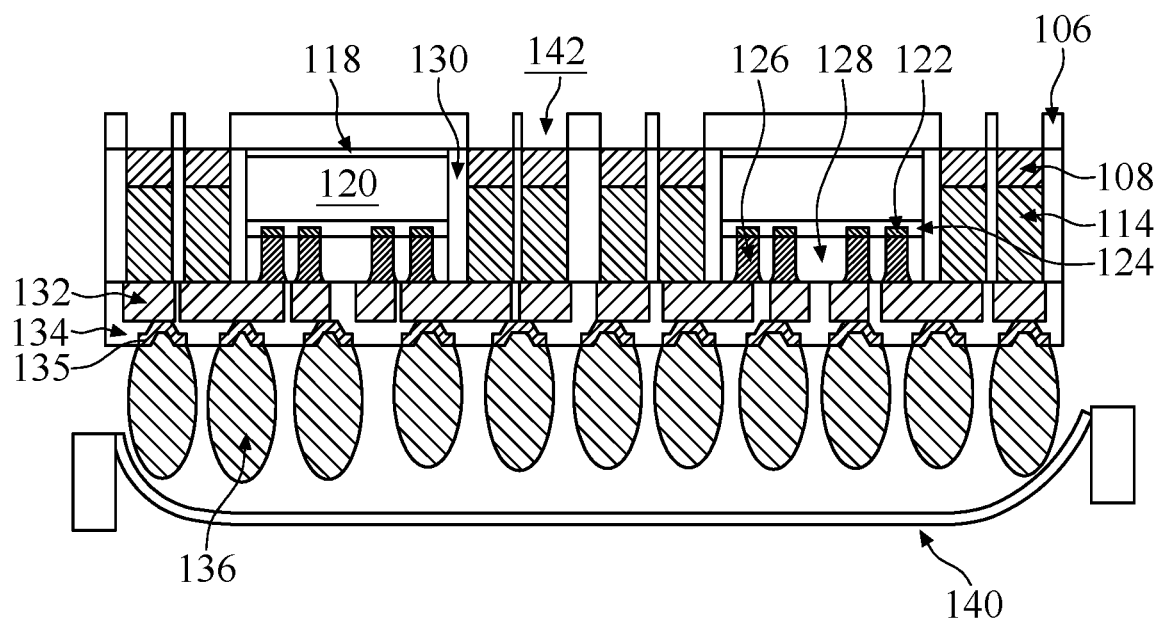
Figure 1N:
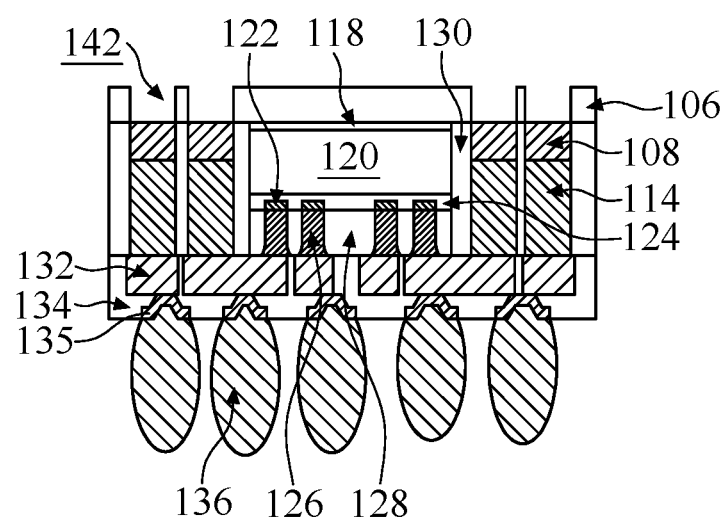
Figure 1O:
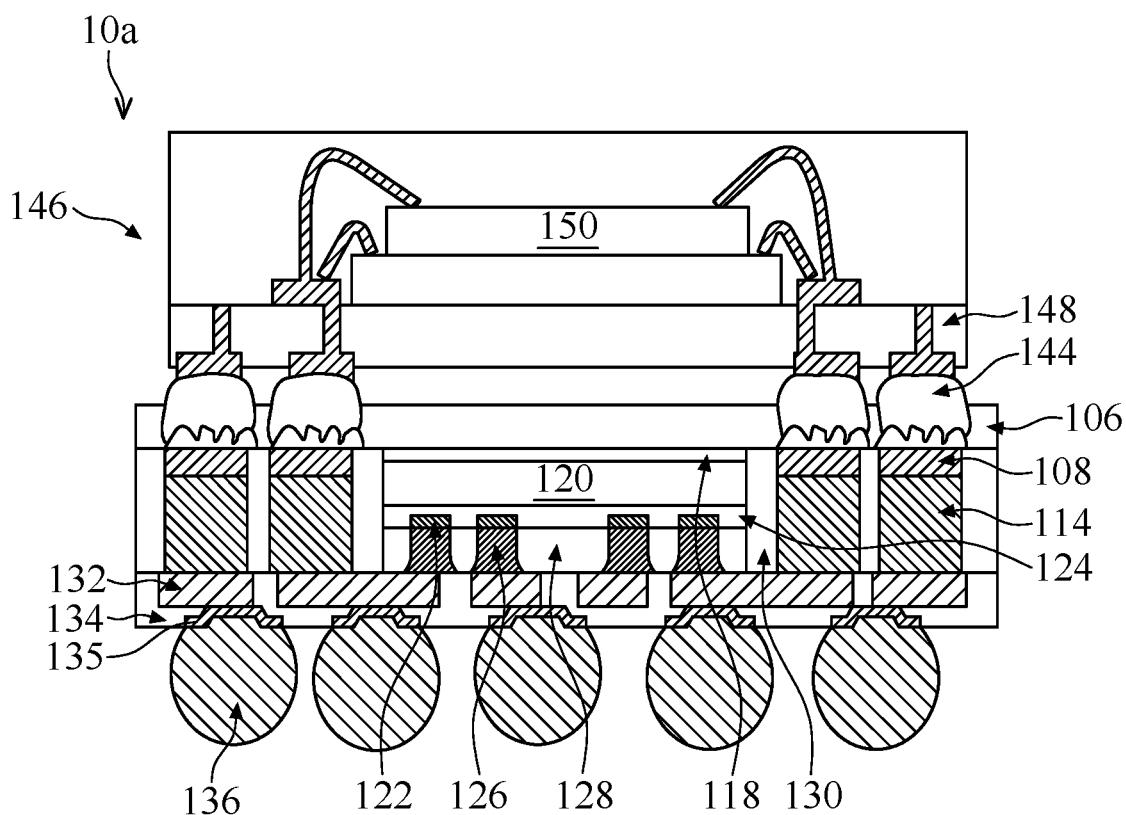

FIGS. 1A-1O are cross-sectional representations of various stages of forming a semiconductor package structure 10a, in accordance with some embodiments of the disclosure. A carrier substrate 102 is provided as shown in FIG. 1A in accordance with some embodiments. The carrier substrate 102 may provide temporary mechanical and structural support during subsequent processing steps. The carrier substrate 102 may include glass, silicon, silicon oxide, aluminum oxide, metal, the like, or a combination thereof. The carrier substrate 102 may include a metal frame.

Next, an adhesive layer 104 is formed over the carrier substrate 102 as shown in FIG. 1A in accordance with some embodiments. The adhesive layer 104 may made of glue or foil. The adhesive layer 104 may be made of a photosensitive material which is easily detached from the carrier substrate 102 by light irradiation. The adhesive layer 104 may be made of a heat-sensitive material.

Afterwards, a buffer layer 106 is formed over the adhesive layer 104 as shown in FIG. 1A in accordance with some embodiments. The buffer layer 106 may be a polymer-based layer. The buffer layer 106 may be made of a poly-p-phenylenebenzobisthiazole (PBO) layer, a polyimide (PI) layer, a solder resist (SR) layer, an Ajinomoto buildup film (ABF), a die attach film (DAF), other applicable materials, or combinations thereof. The adhesive layer 104 and the buffer layer 106 may be deposited or laminated over the carrier substrate 102.

Afterwards, a seed layer 108 is formed over the buffer layer 106 as shown in FIG. 1B, in accordance with some embodiments. The seed layer 108 may be made of metal, such as copper (Cu), titanium (Ti), copper alloy, titanium alloy, or combinations thereof. The seed layer 108 may be formed by a deposition process, such as chemical vapor deposition process (CVD), physical vapor deposition process (PVD), other applicable processes, or a combination thereof.

After the seed layer 108 is formed over the buffer layer 106, a mask layer 110 is formed on the seed layer 108, as shown in FIG. 1C in accordance with some embodiments. Openings 112 are formed in the mask layer 110. As shown in FIG. 1C, the seed layer 108 is exposed from the openings 112. The openings 112 may define the position of the subsequently formed via structures. The mask layer 110 may be made of a photoresist material. The openings 112 may be formed by a patterning process. The patterning process may include a photolithography process and an etching process. The photolithography process may be soft baking, mask aligning, exposure, post-exposure baking, developing the photoresist, rinsing and drying (e.g., hard baking). The etching process may be a dry etching or a wet etching process.

Afterwards, the via structure 114 is formed in the mask layer 110, as shown in FIG. 1D, in accordance with some embodiments. The via structure 114 is filled into the opening 112. The via structure 114 may be made of metal, such as copper (Cu), aluminum (Al), tungsten (W), nickel (Ni), alloy thereof, or a combination thereof. The top-view shape of the via structure 114 may be rectangle, square, circle, or the like. The height of the via structure 114 may be determined by the thickness of the mask layer 110. The via structure 114 may be formed by a plating process. In some embodiments, the plating chemicals of the via structure 114 include copper sulfate. In some embodiments, the via structure 114 is formed under a surface current density of about 0.5 ASD (amps/square decimeter) to about 20 ASD.

Afterwards, the mask layer 110 is removed, as shown in FIG. 1E in accordance with some embodiments. After the mask layer 110 is removed, the sidewalls and the top surface of the via structure 114 may be exposed. The seed layer 108 may be exposed from the via structure 114. The mask layer 110 may be removed by an ashing process, other applicable processes, or a combination thereof.

Next, and an etching process is performed to remove a portion of seed layer 108, as shown in FIG. 1F in accordance with some embodiments. During the etching process, the via structure 114 is used as a mask. As a result, the via structure 114 and the remaining seed layer 108 are referred to as through InFO vias (TIV). The via structure 114 and the seed layer 108 may be made of the same material, and therefore there may be no distinguishable interface between them.

Next, a chip 116 is disposed over the buffer layer 106 between the via structures 114, as shown in FIG. 1G in accordance with some embodiments. The chip 116 may be formed beside the via structures 114. As shown in FIG. 1G, the chip 116 is formed over the buffer layer 106 by an adhesive layer 118. The adhesive layer 118 may be a die attach film (DAF). The height of the via structure 114 may be higher than the height of the chip 116.

Other device elements may be formed in the chip 116. The device elements may include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes may be performed to form device elements, such as deposition, etching, implantation, photolithography, annealing, and/or other applicable processes.

Figures 1, 2:
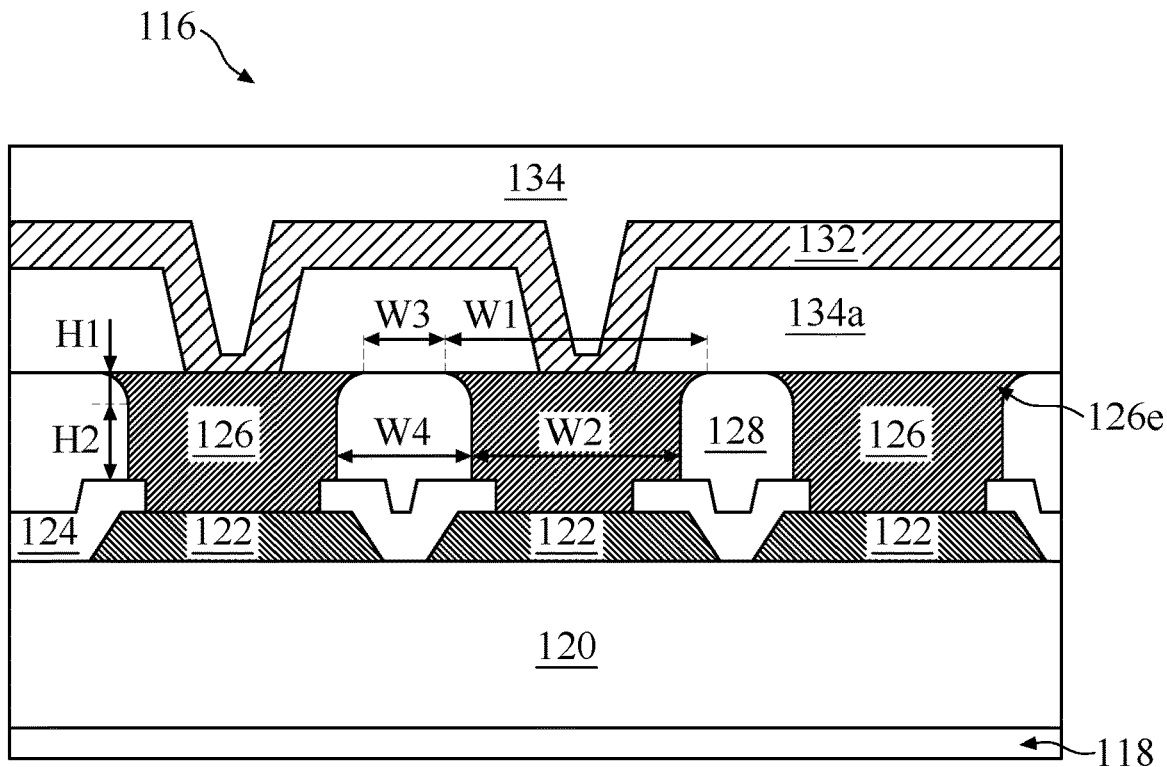
Figure 2:
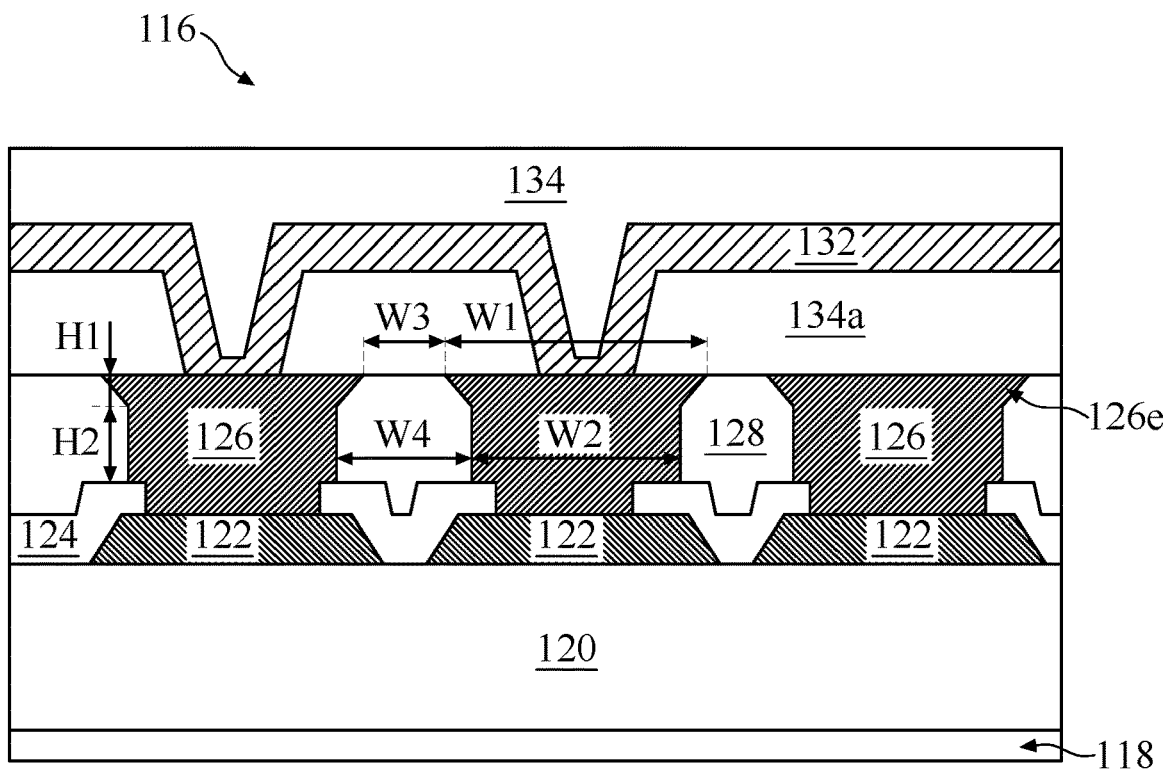

FIGS. 2-1 and 2-2 are enlarged cross-sectional views of the chip 116, in accordance with some embodiments. As shown in FIGS. 2-1 and 2-2, the chip 116 includes a substrate 120, a conductive pad 122, a passivation layer 124, a via structure 126, and a first encapsulating material 128.

As shown in FIGS. 1G, 2-1, and 2-2, a conductive layer 122 is formed over the substrate 120. The conductive layer 122 may be made of metal material such as aluminum (Al), copper (Cu), tungsten (W), gold (Au), other suitable materials, or a combination thereof. The conductive layer 122 may be deposited by an electroplating process, a sputtering process, another applicable process, or a combination thereof. Afterwards, multiple etching processes may be used to pattern the conductive layers 122 to form conductive pads 122, as shown in FIGS. 2-1 and 2-2.

Next, a passivation layer 124 may be conformally formed over the conductive pad 122 and the substrate 120. The passivation layer 124 may be made of polymer material such as polyimide, polybenzoxazole (PBO), benzocyclobutene (BCB), silicone, acrylates, siloxane, other suitable materials, or a combination thereof. The passivation layer 124 may also include non-organic materials such as silicon oxide, un-doped silicate glass, silicon oxynitride, solder resist (SR), silicon nitride, silicon carbide, hexamethyldisilazane (HMDS), other suitable materials, or a combination thereof. The passivation layer 124 may be deposited by a chemical vapor deposition (CVD) process or a spin-on coating process.

Next, the passivation layer 124 may be patterned to form openings exposing the conductive pads 122 (not shown). The openings may be formed by photolithography and etching process. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof.

Afterwards, the via structure 126 is formed in the opening over the conductive pads 122, as shown in FIGS. 2-1 and 2-2 in accordance with some embodiments. The via structure 126 may be formed by a patterning process and a plating process.

The patterning processes for forming the via structure 126 may be the same as, or similar to, those used when forming the via structure 114. For the purpose of brevity, the descriptions of these processes are not repeated herein. The via structure 126 may include copper, aluminum, electroless nickel immersion gold (ENIG), electroless nickel electroless palladium immersion gold (ENEPIG), other suitable materials, or a combination thereof. In some embodiments, the via structure 126 is made of copper.

In some embodiments, the plating chemical of the via structure 126 may include copper sulfate. The hardness of the via structure 126 may be controlled by the surface current density during the plating process. In some embodiments, the via structure 126 is formed under a surface current density of about 2 ASD to about 10 ASD. In this condition, the via structure 126 may be made of ductile copper, which has a hardness of about 0.5 Gpa to about 1.8 Gpa. If the surface current density is too great, the hardness of the via structure 126 may be too great, and there may be voids formed in the via structure 126. If the surface current density is too less, the hardness of the via structure 126 may be too less, and the process time may be also too long.

In some embodiments, the via structure 126 is formed under a surface current density lower than the surface current density used when forming the via structure 114. Therefore, the hardness of the via structure 126 may be lower than the hardness of the via structure 114. In addition, the deposition rate of the via structure 126 may be lower than the deposition rate of the via structure 114. Moreover, the sidewall of the top portion of the via structure 114 may be straight and there may be no lateral protruding portion of the via structure 114.

Next, the first encapsulating material 128 is filled surrounding the via structure 126, as shown in FIGS. 2-1 and 2-2 in accordance with some embodiments. The first encapsulating material 128 may include a molding compound, such as liquid epoxy, deformable gel, silicon rubber, or the like. The first encapsulating material 128 may provide mechanical support and electrical isolation to the via structure 126, and protection to the active circuitry from the environment. The first encapsulating material 128 may be dispensed over the via structure 126 by a capillary flow process. Next, the first encapsulating material 128 may be cured by a thermal curing process, an infrared (IR) energy curing process, a UV curing process, or a combination thereof.

Afterwards, a second encapsulating material 130 is formed over the chip 116 and the via structures 114 and 126, as shown in FIG. 1H in accordance with some embodiments. The second encapsulating material 130 covers the chip 116 and fills up the space between via structures 114 and the space between via structure 114 and the chip 116. As shown in FIG. 1H, the top surface of the second encapsulating material 130 is higher than the top surface of the via structure 114 and the top surface of the chip 116.

The forming processes and material for forming the second encapsulating material 130 may be the same as, or similar to, those used when forming the first encapsulating material 128. For the purpose of brevity, the descriptions of these processes are not repeated herein. The material of the first encapsulating material 128 and the second encapsulating material 130 may be the same.

After the second encapsulating material 130 is deposited, a planarization process is performed to expose the chip 116 and the via structure 114, as shown in FIG. 1I, in accordance with some embodiments of the disclosure. After the planarization process, the top surface of the chip 116 is substantially level with the top surface of the via structure 114. As shown in FIG. 1I, the first encapsulating material 128 is surrounded by the second encapsulating material 130. The planarization process may include grinding process, a chemical mechanical polishing (CMP) process, an etching process, other applicable processes or combinations thereof.

Since the via structure 126 in the chip 116 is formed under a certain plating surface current density range, the via structure 126 may be made of ductile conductive material. In addition, the first encapsulating material 128 may also be malleable. Therefore, the shape of the via structure 126 in a cross-sectional view may be changed by the force of the planarization process. In some embodiments, the top surface of the via structure 126 is enlarged by the planarization process. In some embodiments as shown in FIGS. 2-1 and 2-2, the via structure 126 has a lateral extending portion 126e near the top surface of the via structure 126 embedded in the first encapsulating material 128. As shown in FIGS. 2-1 and 2-2, the lateral extending portion 126e is at the top portion of the via structure 126. With greater top surface area, it may be easier for landing the subsequently formed redistribution layer structure.

In some embodiments as shown in FIG. 2-1, the lateral extending portion 126e has a curved sidewall. In some embodiments as shown in FIG. 2-2, the lateral extending portion 126e has an inclined sidewall. In addition, the slope of the sidewall of the lateral extending portion 126e and the slope of the sidewall of the bottom portion of the via structure 126 are different. In some embodiments, the slope of the sidewall of the lateral extending portion 126e is less than the slope of the sidewall of the bottom portion of the via structure 126.

As shown in FIGS. 2-1 and 2-2, the first encapsulating material 128 surrounds the top portion of the via structure 126 after the planarization process. Therefore, adjacent via structures 126 are separated by the first encapsulating material 128, providing electronic isolation between adjacent via structures 126.

In some embodiments as shown in FIGS. 2-1 and 2-2, since the top surface of the via structures 126 is enlarged by the planarization process, the width W1 of the top surface of the via structure 126 is greater than the width W2 of the bottom surface of the via structure 126. Therefore, there is larger landing area of subsequently formed redistribution layer structure. In some embodiment, the width W1 of the top surface of the via structure 126 is greater than the width W2 of the bottom surface of the via structure 126 by less than 12 μm. If the difference of the width W1 and the width W2 is too great, the distance W3 between adjacent via structures 126 at the top surface of the first encapsulating material 128 may not be enough, and it may cause a short-circuit.

In some embodiments as shown in FIGS. 2-1 and 2-2, the ratio of the width W1 of the top surface of the via structures 126 to the width W2 of the bottom surface of the via structures 126 is in a range of about 1.1 to about 1.5. If the ratio of width W1 to width W2 is too great, the distance W3 between adjacent via structures 126 at the top surface of the first encapsulating material 128 may not be enough, and it may cause a short-circuit. If ratio of the width W1 and the width W2 is too less, the landing area of subsequently formed redistribution layer structure may be not enough.

In some embodiments as shown in FIGS. 2-1 and 2-2, the distance W3 between adjacent via structures 126 at the top surface of the first encapsulating material 128 is in a range of about 4 μm to about 6 μm. If the distance W3 is too great, the landing area of subsequently formed redistribution layer structure may be not enough. If the distance W3 is too less, it may cause a short-circuit.

In some embodiments, the sum of the width W1 of the top surface of the via structures 126 and the distance W3 between adjacent via structures 126 at the top surface of the first encapsulating material 128 is less than 40 μm. If the sum of widths W1 and W3 is too great, it may not be necessary to control the shape of the lateral extending portion 126e of the via structure 126. In some embodiments, the sum of the width W2 of the bottom surface of the via structure 126 and the distance W4 between adjacent via structures 126 at the bottom surface of the first encapsulating material 128 is less than 40 μm. If the sum of widths W2 and W4 is too great, it may not be necessary to control the shape of the lateral extending portion 126e of the via structure 126.

In some embodiments as shown in FIGS. 2-1 and 2-2, the ratio of the height of the lateral extending portion 126e of the via structures 126 to the height of the bottom portion of the via structures 126 is in a range of about 0.1 to about 0.5. If the height ratio is too great, adjacent via structures 126 may merge and there may be an electrical failure. If the height ratio is too low, the landing area of the subsequently formed redistribution layer structure may be not large enough, and the process window for forming the redistribution layer structure may be not enough.

In some embodiments as shown in FIG. 1I, the distance W3 between adjacent via structures 126 at the top surface of the first encapsulating material 128 is less than the distance W5 between adjacent via structures 114. Therefore, the ductile conductive material may be only used for the via structures 126, not for the via structures 114. In this way, the profile of the via structures 126 may be well-controlled, and the process time may be saved.

Next, a redistribution layer (RDL) structure 132 is formed over the via structures 126 and 114, and a polymer layer 134 is formed over the redistribution layer structure 132 as shown in FIG. 1J in accordance with some embodiments. The redistribution layer structure 132 may be electrically connected to the via structures 126 and 114.

The redistribution layer structure 132 may be made of metal such as copper (Cu), copper alloy, aluminum (Al), aluminum alloy, tungsten (W), tungsten alloy, titanium (Ti), titanium alloy, tantalum (Ta), or tantalum alloy. The redistribution layer structure 132 may be formed by plating, electroless plating, sputtering or chemical vapor deposition (CVD). In some embodiments, the redistribution layer structure 132 and the via structure 126 are formed by the same material. In some embodiments, the redistribution layer structure 132 is made of copper.

In some embodiments, the redistribution layer structure 132 and the via structure 126 may be formed under different surface current densities. Therefore, the hardness of the redistribution layer structure 132 and the via structure 126 may be different. In some embodiments, the surface current density of forming the via structure 126 is lower than the surface current density of forming the redistribution layer structure 132. Therefore, the hardness of the redistribution layer structure 132 is greater than the hardness of the via structure 126. In some embodiments, the redistribution layer structure 132 has a hardness of about 1.8 Gpa to about 4 Gpa. With greater hardness of the redistribution layer structure 132, the process time may be saved.

The polymer layer 134 may be made of polybenzoxazole (PBO), benzocyclobutene (BCB), silicone, acrylates, siloxane, or combinations thereof. The polymer layer 134 may be made of non-organic materials, such as silicon oxide, un-doped silicate glass, silicon oxynitride, solder resist (SR), silicon nitride, HMDS (hexamethyldisilazane).

As shown in FIGS. 2-1 and 2-2, a polymer layer 134a is formed between the via structure 126 and the redistribution layer structure 132. Since the adjacent via structures 126 are separated by the first encapsulating layer 128 and the first encapsulating layer 128 is surrounding the via structures 126, the polymer layer 134a is in contact with the first encapsulating layer 128.

The polymer layer 134a may be formed first, and openings are formed in the polymer layer 134a exposing the via structures 126 (not shown). Afterwards, the redistribution layer structure 132 may be conformally formed over the polymer layer 134a and the sidewalls and the bottom surface of the opening in the polymer layer 134a. Therefore, the redistribution layer structure 132 may be in contact with the via structures 126 and is electrically connected to the via structures 126. Later, the polymer layer 134 may be formed in the opening and over the redistribution layer structure 132.

The forming processes and material for forming the polymer layer 134a may be the same as, or similar to, those used when forming the polymer layer 134. For the purpose of brevity, the descriptions of these processes are not repeated herein. In some embodiments, the polymer layer 134 and the polymer layer 134a are made of the same material.

Afterwards, openings may be formed in the polymer layer 134, and the redistribution layer structure 132 may be exposed (not shown). The under bump metallurgy (UBM) layer 135 may be conformally formed in the openings, and electrical connector 136 is formed over the UBM layer 135, as shown in FIG. 1K in accordance with some embodiments. The electrical connector 136 may include solder ball, metal pillar, other applicable connectors, or a combination thereof. The UBM layer 135 may have a solderable metal surface to serve as an interface between the electrical connector 136 and the redistribution layer structure 132. The UBM layer 135 may be made of metal such as copper, nickel, titanium, tungsten, aluminum, other suitable conductive materials, or a combination thereof. The UBM layer 135 may be formed by plating, such as electroplating or electroless plating, other suitable process, or a combination thereof.

Afterwards, the carrier substrate 102 and the adhesive layer 104 are removed, and the structure of FIG. 1K is flipped and attached to a carrier 140, as shown in FIG. 1L, in accordance with some embodiments of the disclosure. As a result, the buffer layer 106 may face up and be exposed. The carrier 140 may include a tape which is photosensitive or heat-sensitive and is easily detached from the electrical connector 136.

Afterwards, a portion of the buffer layer 106 is removed to form opening 142, as shown in FIG. 1M, in accordance with some embodiments of the disclosure. A portion of the seed layer 108 may be removed, and the seed layer 108 may be exposed. The opening 142 may be formed by a laser drilling process, an etching process, or other applicable processes, or a combination thereof.

Afterwards, the semiconductor package structure as shown in FIG. 1M is detached from the carrier 140, and a dicing process is performed to separate the semiconductor package structure into chip packages as shown in FIG. 1N, in accordance with some embodiments of the disclosure.

Next, an electrical connector 144 is filled into the opening 142, as shown in FIG. 1O, in accordance with some embodiments of the disclosure. Afterwards, the top package 146 may be bonded to the electrical connector 144. The top package 146 may include a package substrate 148 and semiconductor dies 150. The semiconductor dies 150 may include memory dies, such as Static Random Access Memory (SRAM) die, Dynamic Random Access Memory (DRAM) die or the like.

By forming the via structure 126 with a ductile conductive material, the top surface of the via structure 126 may be enlarged by the planarization process. Therefore, a lateral extending portion 126e may be formed near the top surface of the via structure 126, and the landing area of the redistribution layer structure 132 may be enlarged. In addition, the profile of the via structure 126 may be well-controlled, and the bridge defect may be reduced and the electrical fail issue may be prevented.

Figure 3A:
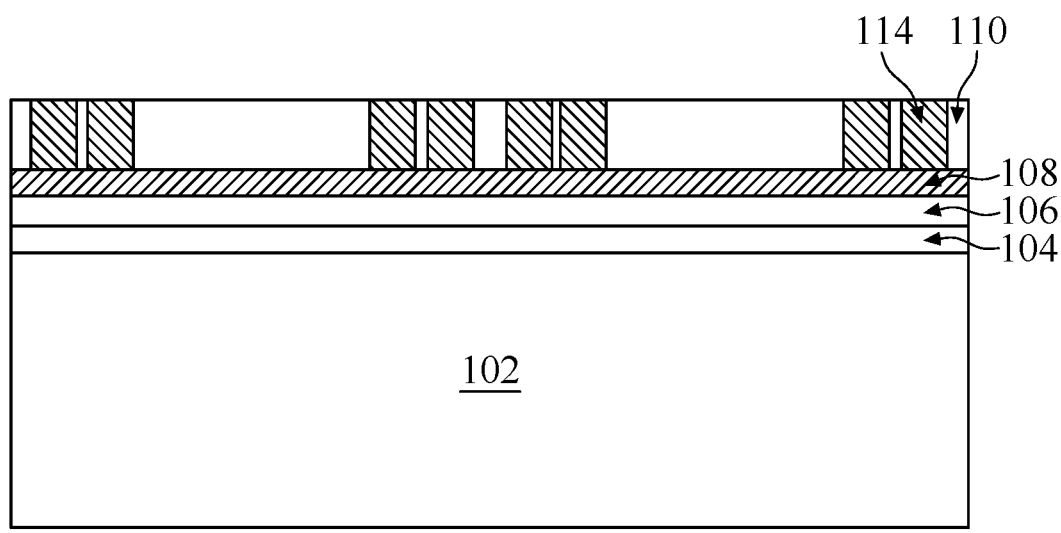
FIGS. 3A-3C are cross-sectional representations of various stages of forming a modified semiconductor package structure, in accordance with some embodiments of the disclosure.
Figure 3B:
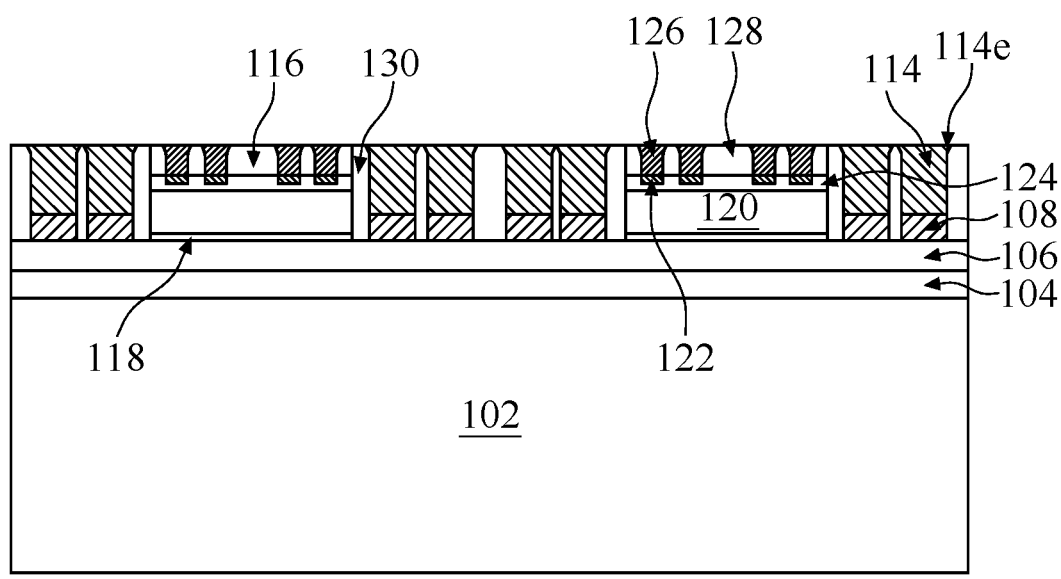
Figure 3C:
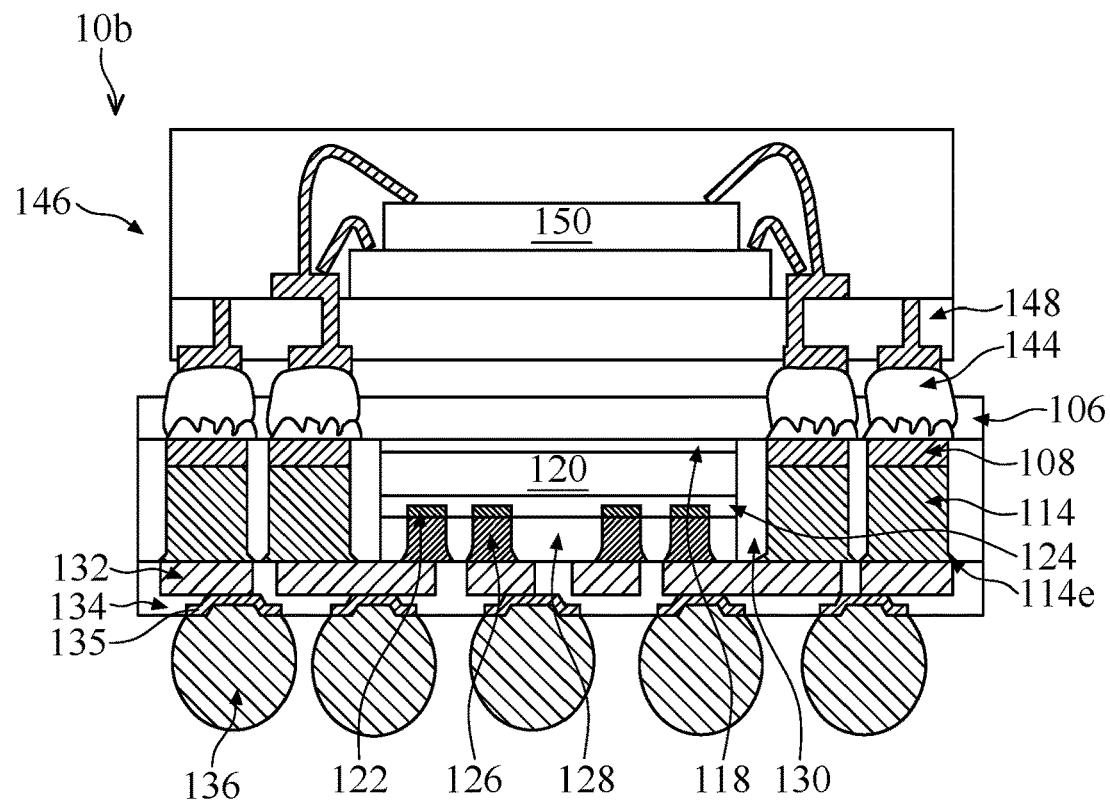

Many variations and/or modifications may be made to the embodiments of the disclosure. FIGS. 3A-3C are cross-sectional representations of various stages of forming a modified semiconductor package structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A in accordance with some embodiments, the via structure 114 is formed under the same or similar surface current density as forming the via structure 126.

In some embodiments as shown in FIG. 3A, the via structure 114 is formed under a surface current density of about 2 ASD to about 10 ASD. In this condition, the via structure 114 may be made of ductile copper, which has a hardness of about 0.5 Gpa to about 1.8 Gpa. If the surface current density is too great, the hardness of the via structure 114 may be too great, and there may be a void forming in the via structure 114. If the surface current density is too less, the hardness of the via structure 114 may be too less, and the process time may be too long.

In some embodiments, the via structure 126 and the via structure 114 are formed under the same or similar surface current density. Therefore, the hardness of the via structure 126 and the via structure 114 may be similar or the same.

Next, as shown in FIG. 3B, after forming the second encapsulating material 130 over the via structures 114 and 126, the planarization process is performed and the top surface of the via structures 114 and 126 are exposed. Since the via structure 114 is made of ductile conductive material, a lateral extending portion 114e is formed after the planarization process. In some embodiments, the top surface of the via structure 114 is enlarged by the planarization process.

In some embodiments as shown in FIG. 3B, the lateral extending portion 114e is embedded in the second encapsulating material 130. In some embodiments, adjacent via structures 114 are separated by the second encapsulating material 130, preventing electrical fail issue.

Next, a redistribution layer structure 132 is formed over the via structures 114 and 126, and the redistribution layer structure 132 is electrically connected to the via structures 114 and 126, as shown in FIG. 3C, in accordance with some embodiments of the disclosure. Since the top surface of the via structure 114 is enlarged, the landing area of the redistribution layer structure 132 may be enlarged. It may be easier to form redistribution layer structure 132 over the via structure 114.

By forming the via structures 114 and 126 with a ductile conductive material, the top surface of the via structures 114 and 126 may be enlarged by the planarization process. Therefore, a lateral extending portions 114e and 126e may be formed near the top surface of the via structures 114 and 126 respectively, and the landing area of the redistribution layer structure 132 may be enlarged. In addition, the profile of the via structures 114 and 126 may be well-controlled, and the bridge defect may be reduced and the electrical fail issue may be prevented.

Figure 4A:
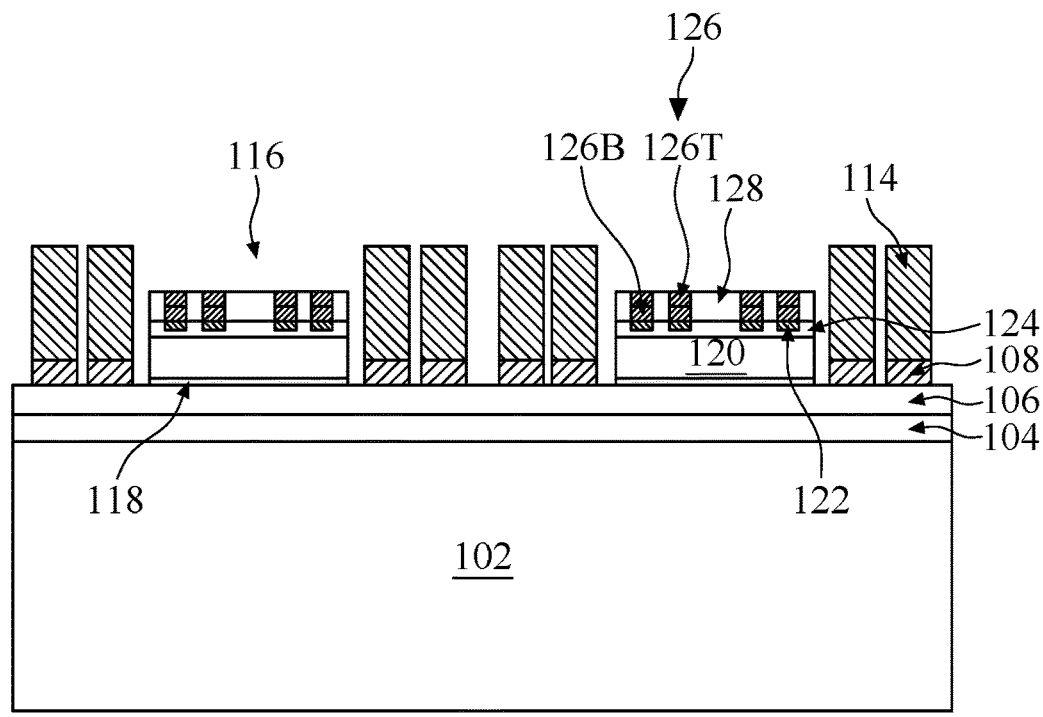
FIGS. 4A-4C are cross-sectional representations of various stages of forming a modified semiconductor package structure, in accordance with some embodiments of the disclosure.
Figure 4B:
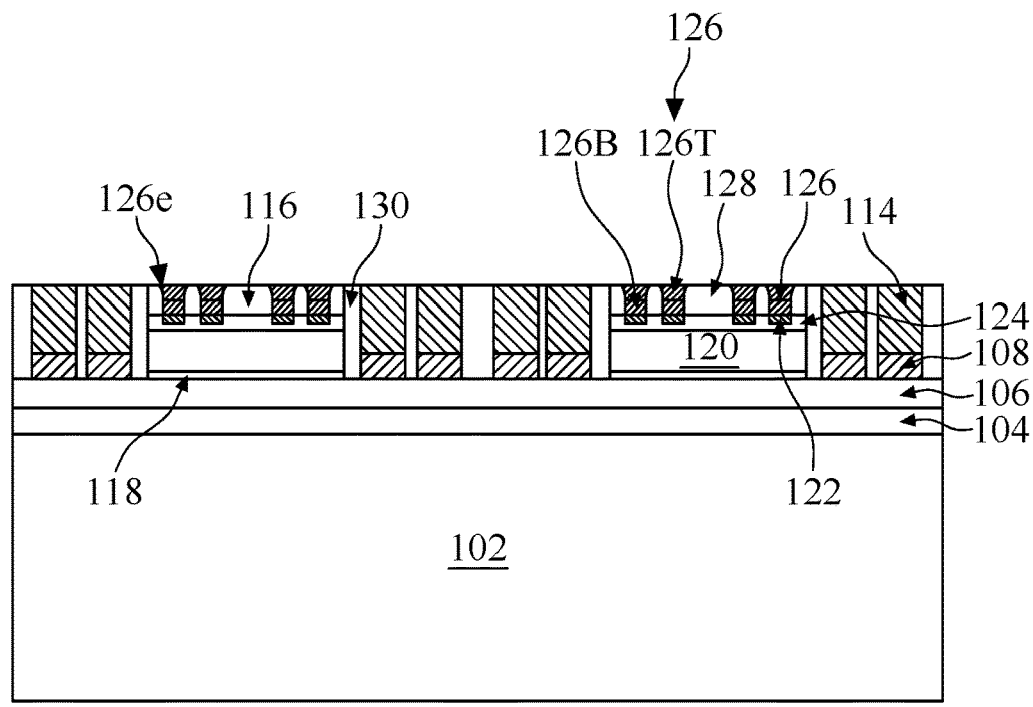
Figure 4C:
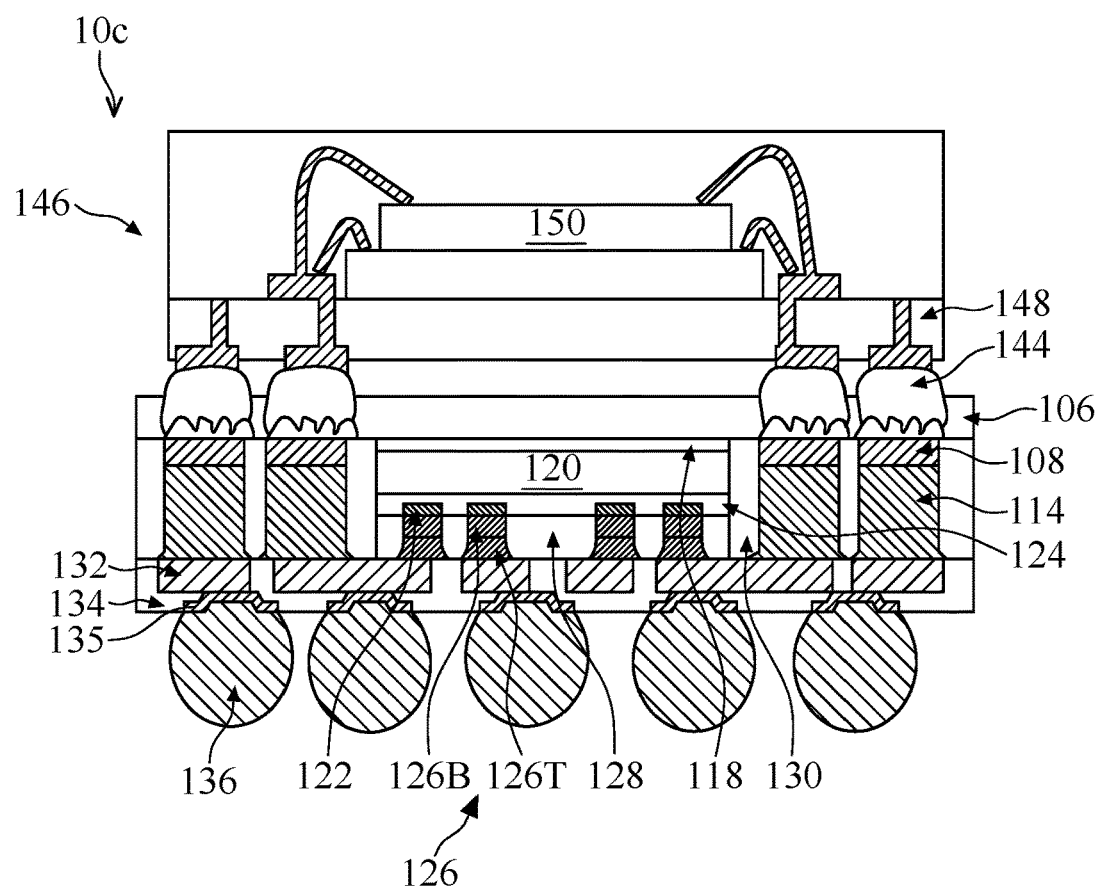

Many variations and/or modifications may be made to the embodiments of the disclosure. FIGS. 4A-4C are cross-sectional representations of various stages of forming a modified semiconductor package structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, the via structure 126 is formed in two steps.

As shown in FIG. 4A, the bottom portion 126B and the top portion 126T are formed under different surface current densities. In some embodiments, the bottom portion 126B of the via structure 126 is formed under a surface current density of about 0.5 ASD to about 20 ASD. In some embodiments, the top portion 126T of the via structure 126 is formed under a surface current density of about 2 ASD to about 10 ASD. In some embodiments, the surface current density of forming the bottom portion 126B of the via structure 126 is greater than the surface current density forming the top portion 126T of the via structure 126. In some embodiments, the bottom portion 126B and the top portion 126T are formed at a different deposition rate. In some embodiments, the bottom portion 126B is formed at a higher deposition rate than the top portion 126T. In some embodiments, the hardness of the bottom portion 126B and the top portion 126T of the via structure 126 are different. In some embodiments, the hardness of the bottom portion 126B is greater than the hardness of the top portion 126T.

Next, after the second encapsulating material 130 is deposited, a planarization process is performed to expose the chip 116 and the via structure 114, as shown in FIG. 4B, in accordance with some embodiments of the disclosure. Since the top portion 126T of the via structure 126 is made of ductile conductive material, a lateral extending portion 126e of the top portion 126T is formed after the planarization process. In some embodiments, the top surface of the top portion 126T of the via structure 126 is enlarged by the planarization process.

Next, a redistribution layer structure 132 is formed over the via structures 126, and the redistribution layer structure 132 is electrically connected to the via structure 126, as shown in FIG. 4C, in accordance with some embodiments of the disclosure. Since the top surface of the top portion 126T of the via structure 126 is enlarged, the landing area of the redistribution layer structure 132 may be enlarged. It may be easier to form the redistribution layer structure 132 over the via structure 126. In addition, the bottom portion 126B may be formed with a faster deposition rate to save production time.

By forming the via structure 126 with a ductile conductive material, the top surface of the via structure 126 may be enlarged by the planarization process. Therefore, a lateral extending portion 126e may be formed near the top surface of the via structure 126, and the landing area of the redistribution layer structure 132 may be enlarged. In addition, the profile of the via structure 126 may be well-controlled, and the bridge defect may be reduced and the electrical fail issue may be prevented. The bottom portion 126B and the top portion 126T of the via structure 126 may be formed under different surface current densities. Therefore, the production time may be saved, and the landing area of the redistribution layer structure 132 may be enlarged at the same time.

Figure 5A:
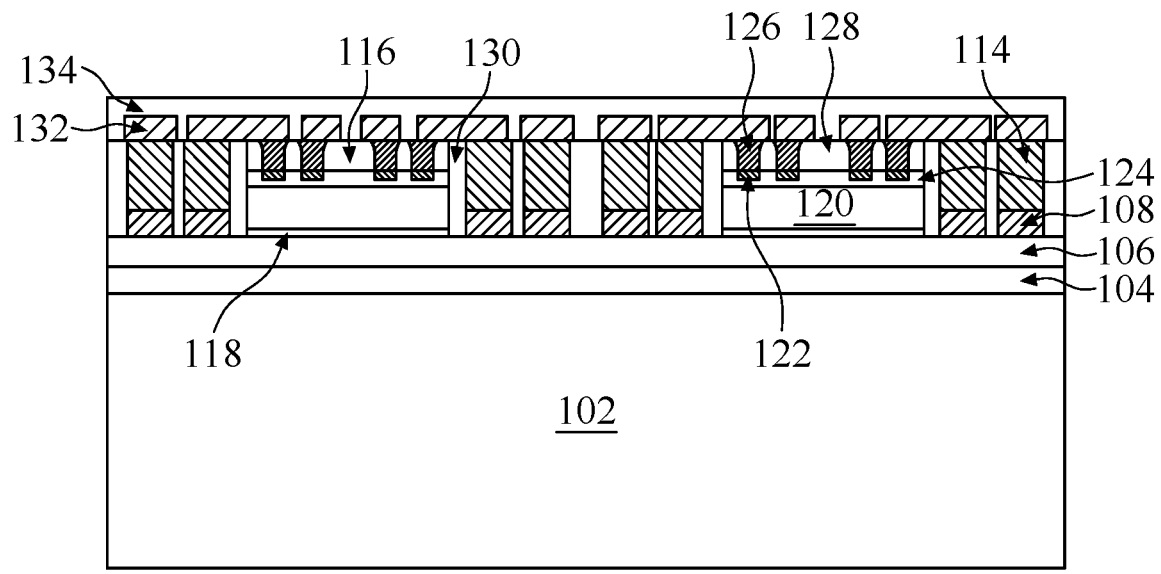
FIGS. 5A-5B are cross-sectional representations of various stages of forming a modified semiconductor package structure, in accordance with some embodiments of the disclosure.
Figure 5B:
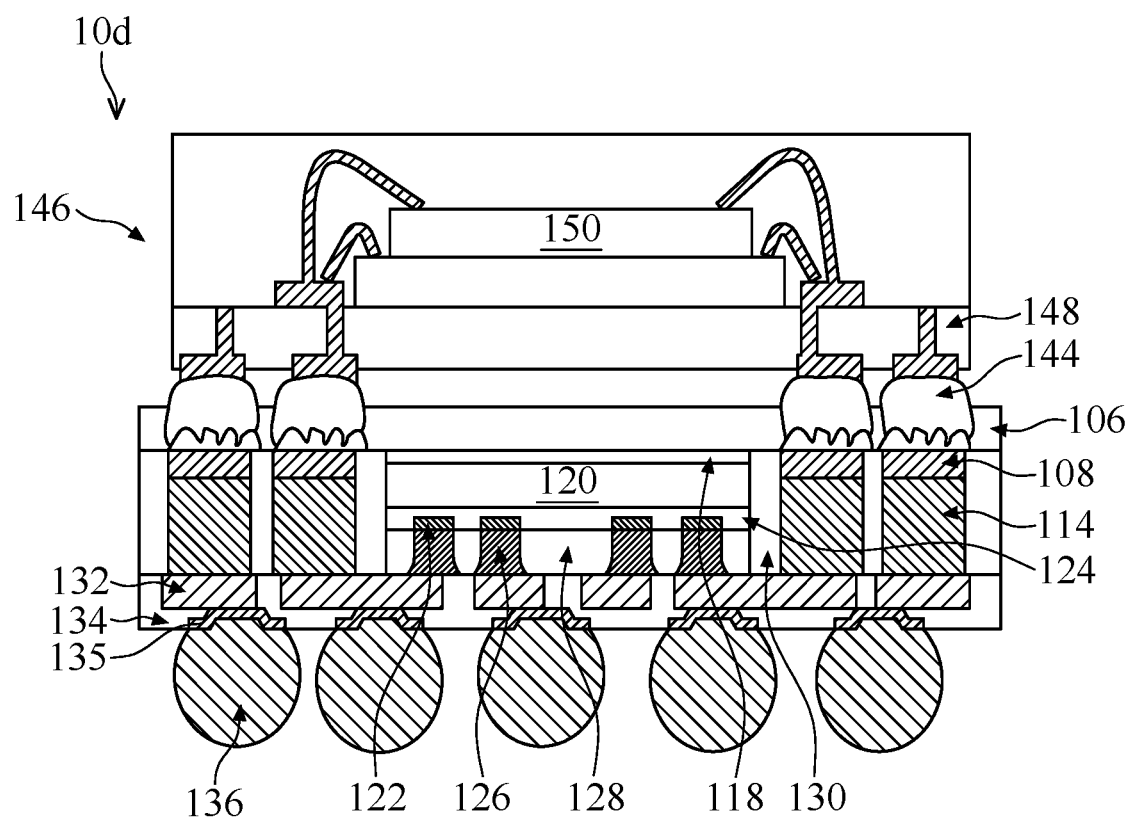

Many variations and/or modifications may be made to the embodiments of the disclosure. FIGS. 5A-5B are cross-sectional representations of various stages of forming a modified semiconductor package structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the redistribution layer structure 132 is formed under the same or similar surface current density as forming the via structure 126.

In some embodiments as shown in FIG. 5A, the redistribution layer structure 132 is formed under a surface current density of about 2 ASD to about 10 ASD. In this condition, the redistribution layer structure 132 may be made of ductile copper, which has a hardness of about 0.5 Gpa to about 1.8 Gpa. If the surface current density is too great, the hardness of the redistribution layer structure 132 may be too great, and there may be a void forming in redistribution layer structure 132. If the surface current density is too less, the hardness of redistribution layer structure 132 may be too less, and the process time may be too long.

In some embodiments, the via structure 126 and the redistribution layer structure 132 are formed under the same or similar surface current density. Therefore, the hardness of the via structure 126 and the redistribution layer structure 132 may be similar or the same. In this way, the redistribution layer structure 132 may be made of ductile conductive material.

Since the planarization of the second encapsulating layer 130 is performed before the planarization redistribution layer structure 132, the top surface area of the redistribution layer structure 132 may remain the same in the following process. With ductile redistribution layer structure 132, the landing process window may be improved, and the resistance may be reduced.

By forming the via structure 126 with a ductile conductive material, the top surface of the via structure 126 may be enlarged by the planarization process. Therefore, a lateral extending portion 126e may be formed near the top surface of the via structure 126, and the landing area of the redistribution layer structure 132 may be enlarged. In addition, the profile of the via structure 126 may be well-controlled, and the bridge defect may be reduced and the electrical fail issue may be prevented. By forming the redistribution layer structure 132 by the ductile conductive material, the landing process window may be improved, and the resistance may be reduced.

As described previously, forming the via structures 126 by a ductile conductive material may enlarge the top surface of the via structures 126 after the planarization process. It may be easier to land the redistribution layer structure 132. The profile of the via structure 126 may be well-controlled by the ductile conductive material, and the bridge defect may be reduced and the electrical fail issue may be prevented when the distance between the via structures is small. In the embodiments as shown in FIGS. 3A-3C, the via structures 114 beside the chip 116 are also made of ductile conductive material, and the top surface of the via structures 114 beside the chip 116 are also enlarged after the planarization process. It may be easier to land the redistribution layer structure 132 over the via structures 114 beside the chip 116. In the embodiments as shown in FIGS. 4A-4C, the top portion of the via structures 126 is made of ductile conductive material and the hardness of the top portion of the via structures 126 is lower than the bottom portion of the via structures 126. It may be easier to land the redistribution layer structure 132 and save production time. In the embodiments as shown in FIGS. 5A-5B, the redistribution layer structure 132 is made of ductile conductive material with lower hardness. The landing process window may be improved, and the resistance may be reduced.

Embodiments of a semiconductor package structure and a method for forming the same are provided. The semiconductor package structure may include via structures made of conductive material with lower hardness. It may be easier to land the redistribution layer structure over the via structure, and the via structure profile may be well-controlled. Furthermore, the bridge defect may be reduced and the electrical fail issue may be prevented.

In some embodiments, a semiconductor package structure is provided. The semiconductor package structure includes a conductive pad formed over a substrate. The semiconductor package structure also includes a passivation layer formed over the conductive pad. The semiconductor package structure also includes a first via structure formed through the passivation layer and in contact with the conductive pad. The semiconductor package structure also includes a first encapsulating material surrounding the first via structure. The semiconductor package structure also includes a redistribution layer structure formed over the first via structure. The first via structure has a lateral extending portion embedded in the first encapsulating material near the top surface of the first via structure.

In some embodiments, a semiconductor package structure is provided. The semiconductor package structure includes a chip including first via structures over a substrate. The semiconductor package structure also includes second via structures formed beside the chip. The semiconductor package structure also includes a redistribution layer structure formed over the first via structures and the second via structures. The first via structures comprise a top portion and a bottom portion. The slope of the sidewall of the top portion of the first via structures is different than the slope of the sidewall of the bottom portion of the first via structures.

In some embodiments, a method for forming a semiconductor package structure is provided. The method for forming a semiconductor package structure includes forming a conductive pad over a substrate. The method for forming a semiconductor package structure also includes conformally depositing a passivation layer over the conductive pad. The method for forming a semiconductor package structure also includes patterning the passivation layer to form an opening exposing the conductive pad. The method for forming a semiconductor package structure also includes forming a first via structure in the opening over the conductive pad. The method for forming a semiconductor package structure also includes depositing a first encapsulating material surrounding the first via structure. The method for forming a semiconductor package structure also includes planarizing the first encapsulating material to expose the top surface of the first via structure. The top surface of the first via structure is enlarged by planarizing the first encapsulating material. The method for forming a semiconductor package structure also includes forming a redistribution layer structure electrically connected to the first via structure.

In some embodiments, a semiconductor package structure is provided. The semiconductor package structure includes a conductive pad formed over a substrate. The semiconductor package structure also includes a passivation layer formed over the conductive pad. The semiconductor package structure further includes a first via structure formed through the passivation layer and in contact with the conductive pad. The semiconductor package structure also includes a first encapsulating material surrounding the first via structure. The semiconductor package structure further includes a redistribution layer structure formed over the first via structure. The first via structure has a lateral extending portion embedded in the first encapsulating material near a top surface of the first via structure, and the lateral extending portion has a width increasing in a direction toward the redistribution layer structure.

In some embodiments, a semiconductor package structure is provided. The semiconductor package structure includes a chip including first via structures over a substrate. The semiconductor package structure also includes second via structures formed beside the chip. The semiconductor package structure further includes a redistribution layer structure formed over the first via structures and the second via structures. Each of the first via structures includes a top portion and a bottom portion, and a slope of a sidewall of the top portion of the first via structures and a slope of a sidewall of the bottom portion of the first via structures are different.

In some embodiments, a semiconductor package structure is provided. The semiconductor package structure includes a conductive pad formed over a substrate. The semiconductor package structure also includes an electrical connector formed below the substrate. The semiconductor package structure further includes a first via structure electrically connected to the conductive pad. The semiconductor package structure also includes a first encapsulating material surrounding the first via structure. A top portion of the first encapsulating material is partially covered by the first via structure. The semiconductor package structure further includes a second via structure adjacent to the substrate and electrically connected to the electrical connector. The semiconductor package structure also includes a redistribution layer structure electrically connected to the first via structure and the second via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
    a conductive pad formed over a substrate;
    a passivation layer formed over the conductive pad;
    a first via structure formed through the passivation layer and in contact with the conductive pad;
    a first encapsulating material surrounding the first via structure; and
    a redistribution layer structure formed over the first via structure,
    wherein the first encapsulating material is disposed between the redistribution layer structure and the passivation layer, the first via structure has a lateral extending portion embedded in the first encapsulating material near a top surface of the first via structure, and the lateral extending portion has a width increasing in a direction toward the redistribution layer structure.

2. The semiconductor package structure as claimed in claim 1, wherein the lateral extending portion has a curved sidewall or an inclined sidewall.

3. The semiconductor package structure as claimed in claim 1, wherein the first via structure is made of copper, aluminum, or a combination thereof.

4. The semiconductor package structure as claimed in claim 1, further comprising:
    a second via structure formed beside the substrate,
    wherein the second via structure is electrically connected to the redistribution layer structure, and the second via structure has a second lateral extending portion in a second encapsulating material surrounding the first encapsulating material.

5. The semiconductor package structure as claimed in claim 1, wherein the lateral extending portion is wider than a straight portion of the first via structure.

6. A semiconductor package structure, comprising:
    a chip including first via structures over a substrate;
    second via structures formed beside the chip; and
    a redistribution layer structure formed over the first via structures and the second via structures,
    wherein each of the first via structures comprises a top portion and a bottom portion, and a slope of a sidewall of the top portion of the first via structures and a slope of a sidewall of the bottom portion of the first via structures are different, and a hardness of the bottom portion of the first via structures is greater than a hardness of the top portion of the first via structures.

7. The semiconductor package structure as claimed in claim 6, wherein the slope of the sidewall of the top portion of the first via structures is less than the slope of the sidewall of the bottom portion of the first via structures.

8. The semiconductor package structure as claimed in claim 6, wherein a height of the top portion of the first via structures is less than a height of the bottom portion of the first via structures.

9. The semiconductor package structure as claimed in claim 6, wherein the top portion of the first via structures is in contact with the redistribution layer structure and the bottom portion of the first via structures is in contact with a conductive pad.

10. The semiconductor package structure as claimed in claim 6, further comprising:
    a first polymer layer formed between the first via structures and the redistribution layer structure;
    a second polymer layer formed over the redistribution layer structure; and
    an encapsulating layer formed surrounding the first via structures,
    wherein the encapsulating layer is in contact with the first polymer layer.

11. The semiconductor package structure as claimed in claim 6, wherein a ratio of a width of a top surface of the first via structures to a width of a bottom surface of the first via structures is in a range of about 1.1 to about 1.5.

12. The semiconductor package structure as claimed in claim 6, wherein a distance between the top portions of the first via structures is less than a distance between the bottom portions of the first via structures.

13. A semiconductor package structure, comprising:
   a conductive pad formed over a substrate;
   a passivation layer formed over the conductive pad;
   an electrical connector formed below the substrate;
   a first via structure electrically connected to the conductive pad;
   a first encapsulating material surrounding the first via structure, wherein a top portion of the first encapsulating material is partially covered by the first via structure;
   a second via structure adjacent to the substrate and electrically connected to the electrical connector; and
   a redistribution layer structure electrically connected to the first via structure and the second via structure,
   wherein the first via structure has a first portion above a top surface of the passivation layer, and the first portion of the first via structure has a first width and a second width that is less than the first width.

14. The semiconductor package structure as claimed in claim 13, wherein the top portion of the first encapsulating material is tapered.

15. The semiconductor package structure as claimed in claim 13, wherein the electrical connector is formed in a buffer layer, and the substrate is formed over the buffer layer by an adhesive layer.

16. The semiconductor package structure as claimed in claim 15, further comprising:
   a second encapsulating material formed between the buffer layer and the redistribution layer structure and surrounding the substrate and the second via structure.

17. The semiconductor package structure as claimed in claim 16, wherein sidewalls of the buffer layer, the second encapsulating material, and the redistribution layer structure are coplanar.

18. The semiconductor package structure as claimed in claim 16, wherein a top portion of the second encapsulating material is partially covered by the second via structure.

19. The semiconductor package structure as claimed in claim 13, wherein the first via structure has a second portion laterally sandwiched between the passivation layer, and the second portion of the first via structure has a third width that is less than the second width.

20. The semiconductor package structure as claimed in claim 13, wherein a hardness of the first via structure and a hardness of the redistribution layer structure are the same.

* * * * *